(12) United States Patent
Bains

(10) Patent No.: US 8,386,676 B2
(45) Date of Patent: *Feb. 26, 2013

(54) SYSTEMS, METHODS, AND APPARATUSES FOR TRANSMITTING DATA MASK BITS TO A MEMORY DEVICE

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 230 days.

This patent is subject to a terminal disclaimer.

(21) Appl. No.: 11/758,248

(22) Filed: Jun. 5, 2007

(65) Prior Publication Data

US 2008/0304330 A1    Dec. 11, 2008

(51) Int. Cl.
*G06F 13/12* (2006.01)
*G06F 13/38* (2006.01)
(52) U.S. Cl. .......................... 710/74; 711/100
(58) Field of Classification Search ............ 710/30, 710/66
See application file for complete search history.

(56) References Cited

U.S. PATENT DOCUMENTS

| | | | |
|---|---|---|---|
| 4,306,298 A * | 12/1981 | McElroy | 711/211 |
| 4,593,373 A * | 6/1986 | Kiuchi et al. | 708/518 |
| 6,148,351 A * | 11/2000 | Takase | 710/66 |
| 6,718,444 B1 * | 4/2004 | Hughes | 711/155 |
| 6,880,026 B2 * | 4/2005 | Imming et al. | 710/106 |
| 6,888,760 B2 | 5/2005 | LaBerge | |
| 7,171,496 B2 * | 1/2007 | Tanaka et al. | 710/66 |
| 2007/0061494 A1 * | 3/2007 | Wallner et al. | 710/52 |
| 2007/0094563 A1 * | 4/2007 | Kim et al. | 714/746 |
| 2007/0101073 A1 | 5/2007 | Macri et al. | |

OTHER PUBLICATIONS

Pending, U.S. Appl. No. 11/364,107, filed Feb. 27, 2006, to K. Bains.
Pending, U.S. Appl. No. 11/479,067, filed Jun. 30, 2006, to K. Bains.
Pending, U.S. Appl. No. 11/591,127, filed Oct. 31, 2006, to K. Bains.
Pending, U.S. Appl. No. 11/704,778, filed Feb. 9, 2007, to K. Bains.
Office Action in Chinese Patent Application No. 200810109658.0 mailed Apr. 28, 2011, 5 pgs.
Office Action in Chinese Patent Application No. 200810109658.0 mailed Aug. 26, 2011, 1 pg.

* cited by examiner

*Primary Examiner* — Elias Mamo
(74) *Attorney, Agent, or Firm* — Blakely, Sokoloff, Taylor & Zafman LLP

(57) ABSTRACT

Embodiments of the invention are generally directed to systems, methods, and apparatuses for transferring data mask bits to a memory device. In some embodiments, an integrated circuit includes logic to issue a partial write command to a memory device. In addition, the integrated circuit may include logic to transfer a write frame to the volatile memory device over an N bit wide data bus, wherein the write frame includes one or more data mask bits to be transferred over the N bit wide data bus.

20 Claims, 5 Drawing Sheets

|     |       | Transfer |        |        |        |        |        |        |
|-----|-------|----------|--------|--------|--------|--------|--------|--------|
|     |       | 0        | 1      | 2      | 3      | 4      | 5      | 6      | 7      |
| DQ0 | DM0=1 |          | Byte 1 | Byte 2 | Byte 3 | Byte 4 | Byte 5 | Byte 6 | Byte 7 |
| DQ1 | DM1=0 |          |        |        |        |        |        |        |        |
| DQ2 | DM2=0 |          |        |        |        |        |        |        |        |
| DQ3 | DM3=0 |          |        |        |        |        |        |        |        |
| DQ4 | DM4=0 |          |        |        |        |        |        |        |        |
| DQ5 | DM5=0 |          |        |        |        |        |        |        |        |
| DQ6 | DM6=0 |          |        |        |        |        |        |        |        |
| DQ7 | DM7=0 |          |        |        |        |        |        |        |        |

|     |       | Transfer |        |        |        |        |        |        |
|-----|-------|----------|--------|--------|--------|--------|--------|--------|--------|
|     |       | 0        | 1      | 2      | 3      | 4      | 5      | 6      | 7      |
| DQ0 | DM0=0 | Byte 0   |        | Byte 2 | Byte 3 | Byte 4 | Byte 5 | Byte 6 | Byte 7 |
| DQ1 | DM1=1 |          |        |        |        |        |        |        |        |
| DQ2 | DM2=0 |          |        |        |        |        |        |        |        |
| DQ3 | DM3=0 |          |        |        |        |        |        |        |        |
| DQ4 | DM4=0 |          |        |        |        |        |        |        |        |
| DQ5 | DM5=0 |          |        |        |        |        |        |        |        |
| DQ6 | DM6=0 |          |        |        |        |        |        |        |        |
| DQ7 | DM7=0 |          |        |        |        |        |        |        |        |

|     |       | Transfer |        |        |        |        |        |        |
|-----|-------|----------|--------|--------|--------|--------|--------|--------|--------|
|     |       | 0        | 1      | 2      | 3      | 4      | 5      | 6      | 7      |
| DQ0 | DM0=0 | Byte 0   | Byte 1 |        | Byte 3 | Byte 4 | Byte 5 | Byte 6 | Byte 7 |
| DQ1 | DM1=0 |          |        |        |        |        |        |        |        |
| DQ2 | DM2=1 |          |        |        |        |        |        |        |        |
| DQ3 | DM3=0 |          |        |        |        |        |        |        |        |
| DQ4 | DM4=0 |          |        |        |        |        |        |        |        |
| DQ5 | DM5=0 |          |        |        |        |        |        |        |        |
| DQ6 | DM6=0 |          |        |        |        |        |        |        |        |
| DQ7 | DM7=0 |          |        |        |        |        |        |        |        |

|      |       | Transfer |        |        |        |        |        |          |        |
|------|-------|----------|--------|--------|--------|--------|--------|----------|--------|
|      |       | 0        | 1      | 2      | 3      | 4      | 5      | 6        | 7      |
| DQ0  | DM0=1 |          | Byte 1=0 | Byte 2 | Byte 3 | Byte 4 | Byte 5 | Byte 6=0 | Byte 7 |
| DQ1  | DM1=1 |          |        |        |        |        |        |          |        |
| DQ2  | DM2=0 |          |        |        |        |        |        |          |        |
| DQ3  | DM3=0 |          |        |        |        |        |        |          |        |
| DQ4  | DM4=0 |          |        |        |        |        |        |          |        |
| DQ5  | DM5=0 |          |        |        |        |        |        |          |        |
| DQ6  | DM6=1 |          |        |        |        |        |        |          |        |
| DQ7  | DM7=0 |          |        |        |        |        |        |          |        |

FIG. 6  600

|      |       | Transfer |        |        |        |        |        |          |        |
|------|-------|----------|--------|--------|--------|--------|--------|----------|--------|
|      |       | 0        | 1      | 2      | 3      | 4      | 5      | 6        | 7      |
| DQ0  | DM0=1 |          | Byte 1 | Byte 2 | Byte 3 | Byte 4 | Byte 5 | Byte 6=0 | Byte 7 |
| DQ1  | DM1=0 |          |        |        |        |        |        |          |        |
| DQ2  | DM2=0 |          |        |        |        |        |        |          |        |
| DQ3  | DM3=0 |          |        |        |        |        |        |          |        |
| DQ4  | DM4=0 |          |        |        |        |        |        |          |        |
| DQ5  | DM5=0 |          |        |        |        |        |        |          |        |
| DQ6  | DM6=1 |          |        |        |        |        |        |          |        |
| DQ7  | DM7=0 |          |        |        |        |        |        |          |        |

FIG. 7  700

|      |       | Transfer |        |        |        |        |        |        |          |
|------|-------|----------|--------|--------|--------|--------|--------|--------|----------|
|      |       | 0        | 1      | 2      | 3      | 4      | 5      | 6      | 7        |
| DQ0  | DM0=0 | Byte 0   |        | Byte 2 | Byte 3 | Byte 4 | Byte 5 | Byte 6 | Byte 7=0 |
| DQ1  | DM1=1 |          |        |        |        |        |        |        |          |
| DQ2  | DM2=0 |          |        |        |        |        |        |        |          |
| DQ3  | DM3=0 |          |        |        |        |        |        |        |          |
| DQ4  | DM4=0 |          |        |        |        |        |        |        |          |
| DQ5  | DM5=0 |          |        |        |        |        |        |        |          |
| DQ6  | DM6=0 |          |        |        |        |        |        |        |          |
| DQ7  | DM7=1 |          |        |        |        |        |        |        |          |

| Transfer | | | | | | | | |
|---|---|---|---|---|---|---|---|---|
| | 0 | 1 | 2 | 3 | 4 | 5 | 6 | 7 |
| DQ0 / DM0 | | Data | Data | Data | Data | Data | Data | Data |
| DQ1 / DM1 | | | | | | | | |
| DQ2 / DM2 | | | | | | | | |
| DQ3 / DM3 | | | | | | | | |
| DQ4 / DM4 | | | | | | | | |
| DQ5 / DM5 | | | | | | | | |
| DQ6 / DM6 | | | | | | | | |
| DQ7 / DM7 | | | | | | | | |
| DQ8 / DM8 | | Data | Data | Data | Data | Data | Data | Data |
| DQ9 / DM9 | | | | | | | | |
| DQ10 / DM10 | | | | | | | | |
| DQ11 / DM11 | | | | | | | | |
| DQ12 / DM12 | | | | | | | | |
| DQ13 / DM13 | | | | | | | | |
| DQ14 / DM14 | | | | | | | | |
| DQ15 / DM15 | | | | | | | | |

1100

SYSTEMS, METHODS, AND APPARATUSES FOR TRANSMITTING DATA MASK BITS TO A MEMORY DEVICE

TECHNICAL FIELD

Embodiments of the invention generally relate to the field of integrated circuits and, more particularly, to systems, methods and apparatuses for transferring data mask bits to a memory device.

BACKGROUND

A host (e.g., a memory controller) may perform partial writes to a dynamic random access memory device (DRAM) in which one or more of the bytes of write data are masked. In conventional systems (e.g., double data rate (DDR)1, DDR2, and DDR3), one or more dedicated data mask pins are used to transfer the data mask bits. Typically, the data mask pins are toggling at the same frequency as the data pins (e.g., on the data bus). A conventional system typically uses one data mask signal per byte lane of data. Thus, a ×4 or a ×8 device may have one data mask pin and a ×16 device may have two data mask pins.

BRIEF DESCRIPTION OF THE DRAWINGS

Embodiments of the invention are illustrated by way of example, and not by way of limitation, in the figures of the accompanying drawings in which like reference numerals refer to similar elements.

FIGS. 3-5 illustrate three examples of a partial write frame in which a byte is masked.

FIGS. 6-8 illustrate three examples of a partial write frame in which at least two bytes are masked.

FIG. 11 illustrates one example of a partial write frame format for a ×16 device, according to an embodiment of the invention.

DETAILED DESCRIPTION

Embodiments of the invention are generally directed to systems, methods, and apparatuses for transferring data mask bits to a memory device. In some embodiments, one or more data mask bits are integrated into a partial write frame and are transferred to a memory device via the data bus. Since the data mask bits are transferred via the data bus, the system does not need (costly) data mask pin(s). In addition, data mask bits can be covered by the same cyclic redundancy check (CRC) code that protects the data bits.

Figure 1:
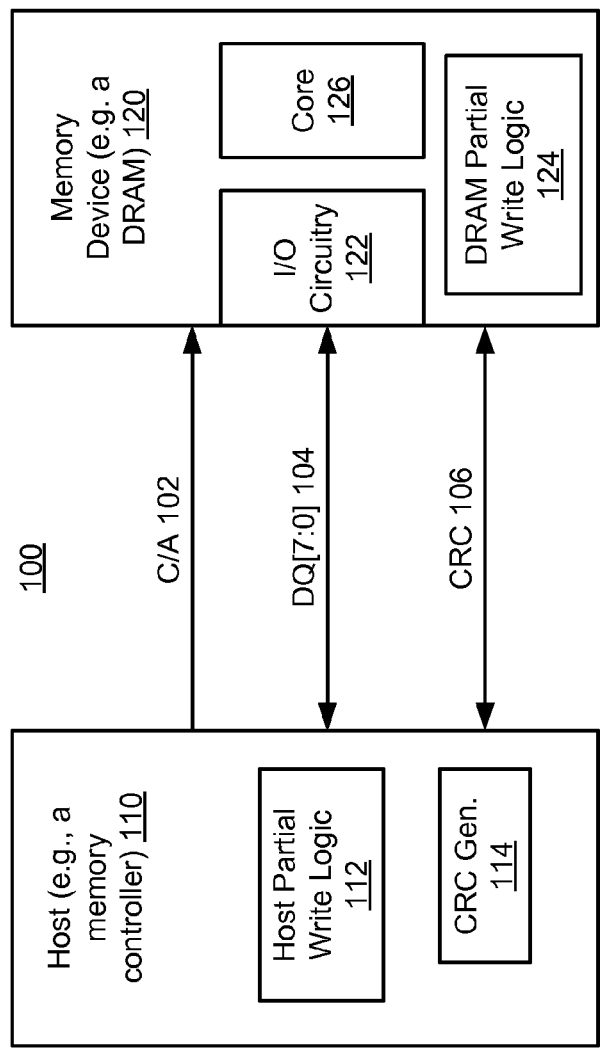
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. In the illustrated embodiment, system 100 includes host 110 (e.g., a memory controller) and memory device 120 (e.g., a dynamic random access memory device or DRAM). In alternative embodiments, system 100 may include more elements, fewer elements, and/or different elements.

Command/Address (C/A) lanes 102 provide a plurality of lanes for sending commands and addresses to memory device 120. DQ lanes 104 provide a bi-directional read/write data bus. CRC lanes 106 provide a bi-directional bus to transfer CRC checksum bits. In alternative embodiments, DQ lanes 104 and/or CRC lanes 106 may be unidirectional. For ease of description, embodiments of the invention are described with reference to a ×8 memory device. It is to be appreciated, however, that embodiments of the invention may include other device data widths such as ×4, ×16, ×32, etc.

Host 110 controls the transfer of data to and from memory device 120. Host 110 includes partial write logic 112 (or, for ease of description, logic 112). Logic 112 enables host 110 to transmit one or more data mask bits in a write data frame. For ease of illustration, logic 112 is illustrated as a single block of logic. It is to be appreciated, however, that the functions provided by logic 112 may be performed by logic that is not necessarily collocated on host 110.

In some embodiments, host 110 encodes a partial write command (e.g., Wm) if the write frame includes data mask bits and encodes a "normal" write (e.g., W) if the write frame does not include data mask bits. The term "partial write frame" refers to a write frame that includes one or more data mask bits to mask at least a portion of the "partial write frame." Host 110 does not need a data mask pin (or pins) because the data mask bits are conveyed over the data bus (e.g., 104) with a partial write frame. In addition, since the data mask bits are conveyed with the data bits, they may be protected by the cyclic redundancy check (CRC) checksum that protects the data bits. Examples of partial write data frames are further discussed with reference to FIGS. 2-8. In some embodiments, host 110 is integrated onto the same die as one or more processors.

Host 110 may also include CRC generator 114. In systems that support the use of CRC, CRC generator 114 generates a local CRC that can be compared with a CRC checksum from memory device 120 to determine whether transmitted data has been corrupted. In addition, a CRC is generated for write transactions and sent to the memory device in the write frame (in systems that support the use of CRC).

Memory device 120 provides (at least a portion of) main system memory for system 100. In some embodiments, memory device 120 is a dynamic random access memory device (DRAM). Memory device 120 includes, inter alia, input/output (I/O) circuitry 122 and partial write logic 124 (or, for ease of reference, logic 124). I/O circuitry 122 includes circuitry suitable for receiving and/or transmitting signals over one or more interconnects (such as C/A 102, DQ 104, and/or CRC 106). For ease of illustration, I/O circuitry 122 is illustrated as a single block of logic. It is to be appreciated, however, that the functions provided by I/O circuitry 122 may be performed by logic that is not necessarily collocated on memory device 120.

Logic 124 enables memory device 120 to write either a normal write frame (e.g., without data mask bits) or a partial write frame (e.g., with data mask bits) to core 126. Logic 124 may decode a transaction as either a normal write (W) or a partial write (Wm). If the transaction is a Wm, then logic 124 uses the data mask bits provided by the partial write frame to mask selected data bits within the partial write frame. Selected aspects of logic 124 are further discussed below with reference to FIG. 9.

Figure 2:
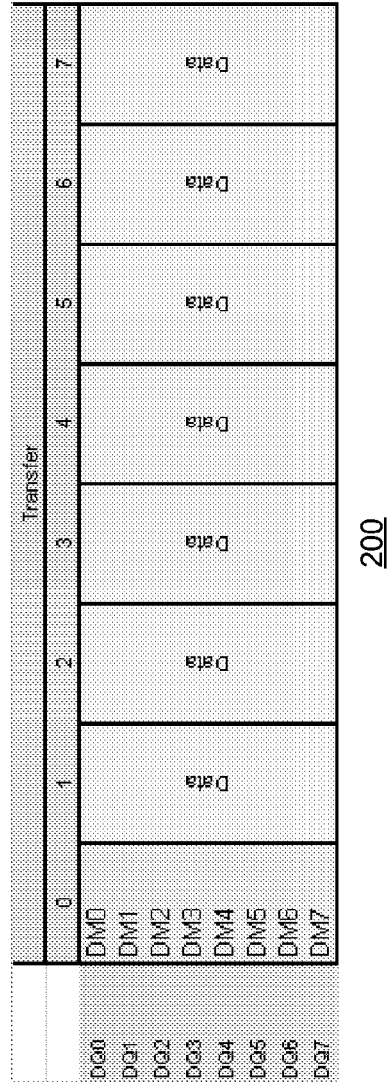
FIG. 2 illustrates one example of a partial write frame format, according to an embodiment of the invention.

FIG. 2 illustrates one example of a partial write frame format, according to an embodiment of the invention. In the illustrated embodiment, the data bus is eight bits wide (e.g., DQ[7:0]) and each write frame has eight user interval (UI) transfers (e.g., UI0-UI7). In alternative embodiments, the data bus may have a different width (e.g., 4, 16, 32, etc.) and/or frame 200 may have a different number of UIs.

In some embodiments, during a partial write transaction, at least one of the eight bytes of data that could be transferred in frame 200 need not be transferred in frame 200. That is, one of the UIs of frame 200 can be used to convey data mask bits because it does not need to convey data bits (since the bits are being masked). In some embodiments, the first UI (e.g., UI0) is used to convey the data mask bits (e.g., eight data mask bits). Allowing DMn to represent a general data mask bit, then, if DMn is equal to 1, then the corresponding Byte-n is masked. Examples of mapping data mask bits to bytes of a partial write frame are further discussed below with reference to FIGS. 3-8.

In some embodiments, partial write logic (e.g., host partial write logic 112, shown in FIG. 1) implements one or more rules regarding byte mapping for the bytes of a partial write frame. The rules regarding byte mapping may be selected to simplify and/or optimize the logic that implements the rules. Examples of byte mapping rules are discussed with reference to FIGS. 3-8. It is to be appreciated that in alternative embodiments, however, different byte mapping rules may be used.

Example Byte Mapping Rule 1

In some embodiments, if one of the bytes of a frame (e.g., frame 200) is masked, then the remaining bytes (e.g., the remaining seven bytes in a frame having eight bytes) are assigned in sequential order in, for example, UI1 through UI7. FIGS. 3-5 illustrate three examples of a partial write frame in which a byte is masked. Referring to FIG. 3, DM0 is set to one in UI0 of frame 300. Thus, byte 0 is masked and bytes 1 through 7 are mapped in sequential order to UI1 through UI7.

FIG. 4 illustrates frame 400 in which DM1 is set to one. Since DM1 is set to one, byte 1 is masked. Thus, byte 0 is mapped to UI1 and bytes 2 through 7 are sequentially mapped to UI2 through UI7. Referring to FIG. 5, DM2 is set to one in UI0 of frame 400. Thus, byte 0 and byte 1 are, respectively, mapped to UI1 and UI2. In addition, bytes 3 through 7 are mapped in sequential order to UI3 through UI7.

Example Byte Mapping Rule 2

In some embodiments, if two or more bytes are masked (e.g., if two or more of the DM bits are set), then the lowest order byte of the masked bytes is not assigned to the frame. The remaining bytes (e.g., the remaining seven bytes in the illustrated examples) are assigned in a sequential order to UI1 through UI7. The sequential order increments from UI1 to UI7.

FIGS. 6-8 illustrate three examples of a partial write frame in which at least two bytes are masked. Referring to FIG. 6, DM0, DM1, and DM6 are set to one in UI0 of frame 600. Thus, byte 0 is not assigned to frame 600, byte 1 is assigned to UI 1, and byte 6 is assigned to UI 6. Bytes 1 through 7 are mapped in sequential order to UI1 through UI7. In some embodiments, the bits of a masked byte that are assigned to a frame are set to zero (e.g., bytes 1 and 6 in frame 600).

FIG. 7 illustrates frame 700 in which DM0 and DM6 are set to one. Thus, byte 0 is not assigned to frame 700 and bytes 1 through 7 are mapped in sequential order to UI1 through UI7. The bits of masked byte 6 are set to zero as shown in UI6. Referring to FIG. 8, DM1 and DM7 are set to one in UI0 of frame 800. Thus, byte 1 is not assigned to frame 800. Bytes 0 through 7 (skipping unassigned byte 1) are mapped in sequential order to UI1 through UI7. In alternative embodiments, different rules may be used to map bytes to a partial write frame.

Figure 9:
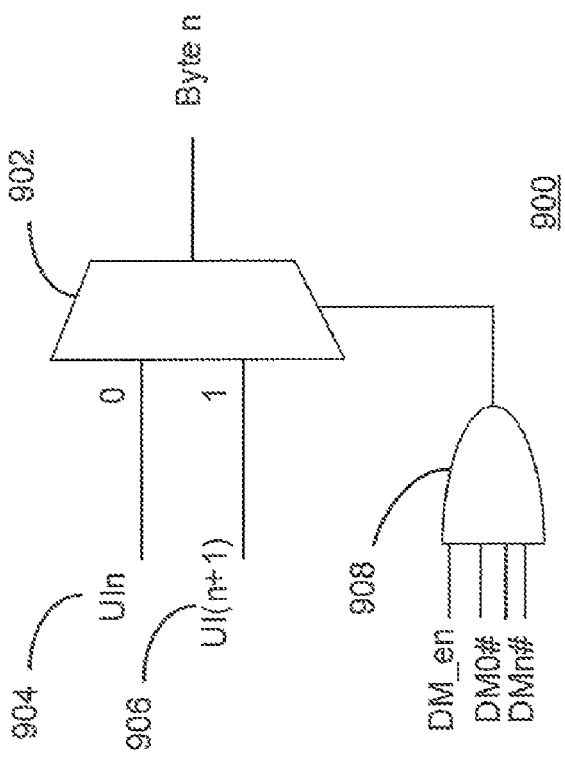
FIG. 9 is a circuit diagram illustrating selected aspects of logic implemented within a memory device to support partial write frames, according to an embodiment of the invention.

FIG. 9 is a circuit diagram illustrating selected aspects of logic implemented within a memory device to support partial write frames, according to an embodiment of the invention. Logic 900 enables a memory device (e.g., a DRAM) to properly write data to the memory core whether the data arrives in a normal write frame or a partial write frame. In some embodiments, the following logic is implemented by logic 900. For a normal write frame, byte n is assigned to UIn. For a partial write frame, byte n is assigned to either UIn or UI(n+1). In alternative embodiments, logic 900 may implement different logic. In some embodiments, the memory device includes an instance of logic 900 for each byte of data in a write frame (e.g., eight instances of logic 900 in an embodiment in which a write frame includes eight bytes of data).

Logic 900 includes 2:1 multiplexer 902. Multiplexer 902 includes a UIn input (904) and a UI(n+1) input (906). The output of AND gate 908 selects the input for multiplexer 902. In some embodiments, the memory device decodes a transaction as either a W or a Wm. If the transaction is a W, then DM_en equals zero and the output of AND gate 908 is zero. Thus, input UIn is selected if the frame is a normal write frame.

If the transaction is a Wm, then DM_en equals one. If all of the DM bits lower than "n" are set to zero, then input UI(n+1) is selected. If one or more of the DM bits are set to one, then input UIn is selected. In alternative embodiments, a DRAM may implement different logic.

Figure 10:
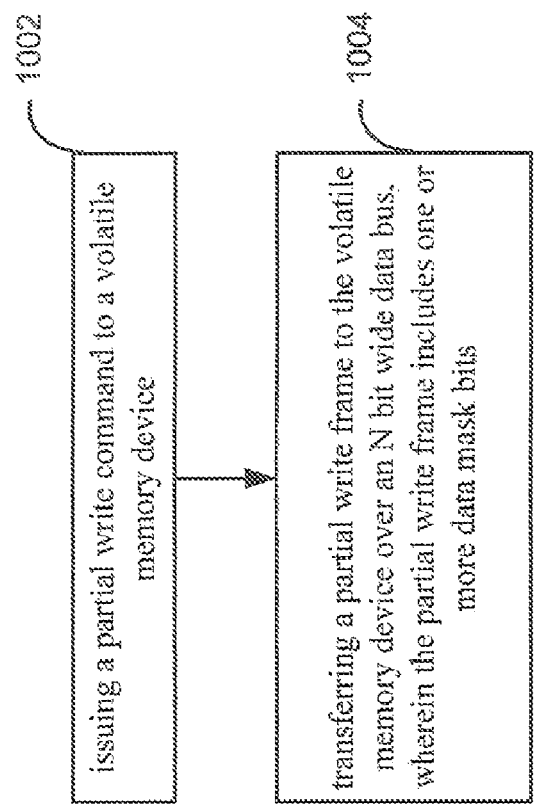
FIG. 10 is a flow diagram illustrating selected aspects of a method for transmitting data mask bits to a memory device, according to an embodiment of the invention.

FIG. 10 is a flow diagram illustrating selected aspects of a method for transmitting data mask bits to a memory device, according to an embodiment of the invention. Referring to process block 1002, a host (e.g., host 110, shown in FIG. 1) issues a partial write command (e.g., Wm) to a memory device (e.g., memory device 120, shown in FIG. 1). In some embodiments, the host is a memory controller and the memory device is a DRAM.

Referring to process block 1004, the host transfers a partial write frame to the volatile memory device over an N bit wide data bus (e.g., DQ 104, shown in FIG. 1). In some embodiments, the partial write frame includes one or more data mask bits to mask at least some of the data bits in the partial write frame. In some embodiments, the host implements rules such as those discussed above, with reference to FIGS. 3-8, to determine byte mapping for the data bytes. In addition, the memory device includes logic (e.g., logic 900, shown in FIG. 9) to properly process both normal write frames and partial write frames.

FIG. 11 illustrates one example of a partial write frame format for a ×16 device, according to an embodiment of the invention. Frame 1100 includes eight UIs (UI0 through UI7) which are transferred over a 16 bit wide data bus. UI0 includes DM bits DM0 through DM15. DM0 through DM7 cover the data bits transferred over DQ0 through DQ15. Similarly, DM8 through DM 15 cover the data bits transferred over DQ8 through DQ15. Thus, in some embodiments, the frame format for a ×16 device is substantially the same as stacking two ×8 frames one on top of another. That is, the byte mapping for the bytes transferred over DQ0 through DQ7 are determined by the values of DM0 through DM7 in accordance with the rules described above with reference to FIGS. 3-8. Similarly, the byte mapping for the bytes transferred over DQ8 through DQ15 are determined by the values of DM8 through DM 15 according to the rules described above. In alternative embodiments, the partial write frame format for a ×16 device may be different.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An integrated circuit capable of being coupled with an N bit wide data bus, the N bit wide data bus to physically couple the integrated circuit with a volatile memory device, the integrated circuit comprising:
   logic to issue a partial write command to the volatile memory device to indicate whether a write frame is a normal write frame that does not include data mask bits or a partial write frame that includes data mask bits; and
   logic to transfer a write frame to the volatile memory device over an N bit wide data bus, wherein the write frame includes one or more data mask bits to be transferred over the N bit wide data bus and cyclic redundancy check (CRC) code that protects data bits also protects the one or more data mask bits.

2. The integrated circuit of claim 1, wherein the write frame includes M user interval (UI) transfers, UI 0 through UI M−1, and the one or more data mask bits are transferred during UI 0.

3. The integrated circuit of claim 2, wherein N is equal to eight and each UI transfer includes a byte of digital information.

4. The integrated circuit of claim 3, wherein, if one of the bytes is masked, then the remaining bytes are assigned to the write frame in a sequential order.

5. The integrated circuit of claim 4, wherein, if two or more bytes are masked, then a lowest order byte is not assigned to the write frame and the remaining bytes are assigned to the write frame in sequential order.

6. The integrated circuit of claim 5, wherein M is eight.

7. The integrated circuit of claim 2, wherein a byte n is assigned to either UIn or UI(n+1).

8. The integrated circuit of claim 1, wherein the integrated circuit comprises a memory controller.

9. The integrated circuit of claim 1, wherein the memory device is a dynamic random access memory device.

10. A volatile memory device capable of being coupled with an N bit wide data bus, the N bit wide data bus to physically couple the integrated circuit with a volatile memory device, the volatile memory device comprising:
    input/output circuitry to receive a write frame from an N bit data bus, wherein the write frame includes one or more data mask bits and further wherein the write frame includes M user interval (UI) transfers, UI 0 through UI M−1, and the one or more data mask bits are transferred during UI 0 and cyclic redundancy check (CRC) code that protects data bits also protects the one or more data mask bits; and
    for each UI, a 2:1 multiplexer to decode the write frame as either a normal write frame or a partial write frame.

11. The volatile memory device of claim 10, wherein the 2:1 multiplexer includes a UIn input and a UI(n+1) input.

12. The volatile memory device of claim 11, wherein the UIn input is selected, if the write frame a normal write frame.

13. The volatile memory device of claim 11, wherein the UI(n+1) input is selected, if the write frame is a partial write frame.

14. The volatile memory device of claim of claim 11, wherein the volatile memory device comprises a dynamic random access memory (DRAM) device.

15. A method for an integrated circuit, the integrated circuit capable of being coupled with an N bit wide data bus, the N bit wide data bus to physically couple the integrated circuit with a volatile memory device, the method comprising:
    issuing a partial write command to the volatile memory device to indicate whether a write frame is a normal write frame that does not include data mask bits or a partial write frame that includes data mask bits; and
    transferring a partial write frame to the volatile memory device over an N bit wide data bus, wherein the partial write frame includes one or more data mask bits and cyclic redundancy check (CRC) code that protects data bits also protects the one or more data mask bits.

16. The method of claim 15, wherein the write frame includes M user interval (UI) transfers, UI 0 through UI M−1, and the one or more data mask bits are transferred during UI 0.

17. The method of claim 16, wherein N is equal to eight and each UI transfer includes a byte of digital information.

18. The method of claim 17, wherein, if one of the bytes is masked, then the remaining bytes are assigned to the write frame in a sequential order.

19. The method of claim 17, wherein, if two or more bytes are masked, then a lowest order byte is not assigned to the write frame and the remaining bytes are assigned to the write frame in sequential order.

20. The method of claim 17, wherein M is eight.

* * * * *